(12) United States Patent
Shi et al.

(10) Patent No.: US 11,129,285 B2
(45) Date of Patent: Sep. 21, 2021

(54) DISPLAY AND ELECTRONIC DEVICE

(71) Applicant: Lenovo (Beijing) Co., Ltd., Beijing (CN)

(72) Inventors: Jun Shi, Beijing (CN); Yong Tan, Beijing (CN); Youze Li, Beijing (CN)

(73) Assignee: LENOVO (BEIJING) CO., LTD., Beijing (CN)

( * ) Notice: Subject to any disclaimer, the term of this patent is extended or adjusted under 35 U.S.C. 154(b) by 0 days.

(21) Appl. No.: 16/729,128

(22) Filed: Dec. 27, 2019

(65) Prior Publication Data

US 2020/0137901 A1 Apr. 30, 2020

(30) Foreign Application Priority Data

Dec. 29, 2018 (CN) .......................... 201811653660.4

(51) Int. Cl.
*H05K 5/00* (2006.01)
*H05K 5/03* (2006.01)
*G06T 3/40* (2006.01)

(52) U.S. Cl.
CPC ......... *H05K 5/0017* (2013.01); *G06T 3/4023* (2013.01); *H05K 5/03* (2013.01)

(58) Field of Classification Search
CPC ............. G02F 2201/52; G02F 2201/56; G06T 3/4023; G06T 19/006; H04M 1/0266; H05K 5/0017; H05K 5/03; G06F 3/011; G06F 3/017; G06F 3/0304; G06F 3/04815; G06F 3/04842
See application file for complete search history.

(56) References Cited

U.S. PATENT DOCUMENTS

| | | | | |
|---|---|---|---|---|
| 9,910,323 | B2* | 3/2018 | Matsushima | G02F 1/133345 |
| 2003/0229900 | A1* | 12/2003 | Reisman | H04N 21/42204 |
| | | | | 725/87 |
| 2013/0050432 | A1* | 2/2013 | Perez | G06F 3/017 |
| | | | | 348/47 |
| 2013/0083064 | A1* | 4/2013 | Geisner | G06F 16/434 |
| | | | | 345/633 |
| 2016/0019856 | A1* | 1/2016 | Tanaka | G09G 3/3677 |
| | | | | 345/206 |
| 2016/0178940 | A1* | 6/2016 | Yuan | G02F 1/133512 |
| | | | | 359/893 |
| 2016/0252768 | A1* | 9/2016 | Zhong | G02F 1/136286 |
| | | | | 349/43 |

(Continued)

FOREIGN PATENT DOCUMENTS

CN 105118383 A 12/2015
CN 205281989 U 6/2016
(Continued)

*Primary Examiner* — Ming Wu
(74) *Attorney, Agent, or Firm* — Anova Law Group, PLLC

(57) ABSTRACT

A display screen includes: a plurality of first pixels, each first pixel including three sub-pixels, the plurality of first pixels constituting a display area of the display screen; and one or more second pixels, each second pixel including three sub-pixels, an arrangement of the three sub-pixels of the second pixel being different from an arrangement of the three sub-pixels of the first pixel, and the one or more second pixels being located at an edge of the display area. The plurality of first pixels and the one or more second pixels constitute a pixel array of the display screen.

16 Claims, 6 Drawing Sheets

(56) References Cited

U.S. PATENT DOCUMENTS

| | | | |
|---|---|---|---|
| 2018/0136513 A1* | 5/2018 | Liu | G02F 1/133512 |
| 2018/0136526 A1* | 5/2018 | Sung | G02F 1/1362 |
| 2018/0314114 A1* | 11/2018 | Shimoshikiryoh | G02F 1/133753 |
| 2018/0321539 A1* | 11/2018 | Koide | G06F 3/0445 |
| 2019/0235307 A1* | 8/2019 | Wang | H01L 27/1248 |

FOREIGN PATENT DOCUMENTS

| | | |
|---|---|---|
| CN | 205334901 U | 6/2016 |
| CN | 105911744 A | 8/2016 |
| CN | 106340249 A | 1/2017 |
| CN | 108258018 A | 7/2018 |
| WO | 2018016691 A1 | 1/2018 |

* cited by examiner

DISPLAY AND ELECTRONIC DEVICE

CROSS-REFERENCE TO RELATED APPLICATION

This application claims the priority to Chinese Patent Application No. 201811653660.4, titled "Display Screen and Electronic Device Having the Same," filed on Dec. 29, 2018, the entire content of which is incorporated herein by reference.

TECHNICAL FIELD

The present disclosure relates to a display screen and an electronic device thereof.

BACKGROUND

With technological developments, display screens of electronic devices have been increasing in relative size and diversity. For example, in a full-screen display electronic device, the display screen may have rounded corners that match the design of the device. In another example, the dial of an electronic watch may be designed as a circular display area. For these irregularly shaped display areas, the display effect at rounded corners and other positions may need to match the boundary shape of the display area as much as possible. As a result, some pixels on the border may be blocked and may not be displayed completely. However, since each pixel is usually composed of three sub-pixels, such as red, green, and blue, when a pixel is not displayed completely, the proportion of the red, green, and blue sub-pixels of the pixel may change, resulting in a distorted pixel display, which in turn may cause color display distortion or jagged displays at the boundaries of the display area.

SUMMARY

In one aspect of the present disclosure, a display screen is provided. The display screen includes: a plurality of first pixels, each first pixel including three sub-pixels, the plurality of first pixels constituting a display area of the display screen; and one or more second pixels, each second pixel including three sub-pixels, an arrangement of the three sub-pixels of the second pixel being different from an arrangement of the three sub-pixels of the first pixel, and the one or more second pixels being located at an edge of the display area; wherein the plurality of first pixels and the one or more second pixels constitute a pixel array of the display screen.

In certain embodiments of the display screen, areas occupied by the three sub-pixels of the second pixel are different from areas occupied by the three sub-pixels of the first pixel.

In certain embodiments of the display screen, boundary lines dividing the areas occupied by the three sub-pixels of the second pixel are parallel to each other and form a second angle with a first side of a substrate of the second pixel, the second angle not being equal to 90° or 180°; and boundary lines dividing the areas occupied by the three sub-pixels of the first pixel are parallel to each other and form a first angle with a first side of a substrate of the first pixel, the first angle being 90° or 180°.

In certain embodiments, the display screen further includes a transparent cover plate, an inner surface of the transparent cover plate having a light-blocking region and a remaining area, and a boundary between the light-blocking region the remaining area of the transparent cover plate including at least one curved portion; wherein the transparent cover plate is located above the pixel array, and one or more pixels of the pixel array corresponding to a curve portion of the boundary line are one or more second pixels.

In certain embodiments of the display screen, the light-blocking region covers at least a first portion of each second pixel; and areas of the three sub-pixels corresponding to a second portion of the second pixel that is not blocked by the light-blocking region are equal in size.

In certain embodiments of the display screen, the boundary between the light-blocking region and the remaining area of the transparent cover plate includes a plurality of curved portions; and for each curved portion, a pixel corresponding to the curve portion is one of the second pixels.

In certain embodiments of the display screen, the three sub-pixels of each first pixel includes a red sub-pixel, a green sub-pixel, and a blue sub-pixel; and the three sub-pixels of each second pixel includes a red sub-pixel, a green sub-pixel, and a blue sub-pixel.

In certain embodiments of the display screen, the display screen includes one or more rounded corners.

In certain embodiments of the display screen, the display screen includes a circular hole.

In certain embodiments of the display screen, the light-blocking region includes a black matrix.

In another aspect of the present disclosure, an electronic device is provided. The electronic device includes a display screen; and a processor, configured to display content on the display screen; wherein the display screen includes: a plurality of first pixels, each first pixel including three sub-pixels, the plurality of first pixels constituting a display area of the display screen; and one or more second pixels, each second pixel including three sub-pixels, an arrangement of the three sub-pixels of the second pixel being different from an arrangement of the three sub-pixels of the first pixel, and the one or more second pixels being located at an edge of the display area; wherein the plurality of first pixels and the one or more second pixels constitute a pixel array of the display screen.

In certain embodiments of the electronic device, areas occupied by the three sub-pixels of the second pixel are different from areas occupied by the three sub-pixels of the first pixel.

In certain embodiments of the electronic device, boundary lines dividing the areas occupied by the three sub-pixels of the second pixel are parallel to each other and form a second angle with a first side of a substrate of the second pixel, the second angle not being equal to 90° or 180°; and boundary lines dividing the areas occupied by the three sub-pixels of the first pixel are parallel to each other and form a first angle with a first side of a substrate of the first pixel, the first angle being 90° or 180°.

In certain embodiments of the electronic device, the display screen further includes a transparent cover plate, an inner surface of the transparent cover plate having a light-blocking region and a remaining area, and a boundary between the light-blocking region the remaining area of the transparent cover plate including at least one curved portion; wherein the transparent cover plate is located above the pixel array, and one or more pixels of the pixel array corresponding to a curve portion of the boundary line are one or more second pixels.

In certain embodiments of the electronic device, the light-blocking region covers at least a first portion of each second pixel; and areas of the three sub-pixels corresponding to a second portion of the second pixel that is not blocked by the light-blocking region are equal in size.

In certain embodiments of the electronic device, the boundary between the light-blocking region and the remaining area of the transparent cover plate includes a plurality of curved portions; and for each curved portion, a pixel corresponding to the curve portion is one of the second pixels.

In certain embodiments of the electronic device, the three sub-pixels of each first pixel includes a red sub-pixel, a green sub-pixel, and a blue sub-pixel; and the three sub-pixels of each second pixel includes a red sub-pixel, a green sub-pixel, and a blue sub-pixel.

In certain embodiments of the electronic device, the display screen includes one or more rounded corners.

In certain embodiments of the electronic device, the display screen includes a circular hole.

In certain embodiments of the electronic device, the light-blocking region includes a black matrix.

BRIEF DESCRIPTION OF THE DRAWINGS

For a more complete understanding of the present disclosure and its advantages, reference will now be made to the following description in conjunction with the accompanying drawings, in which.

DETAILED DESCRIPTION

Figure 1:
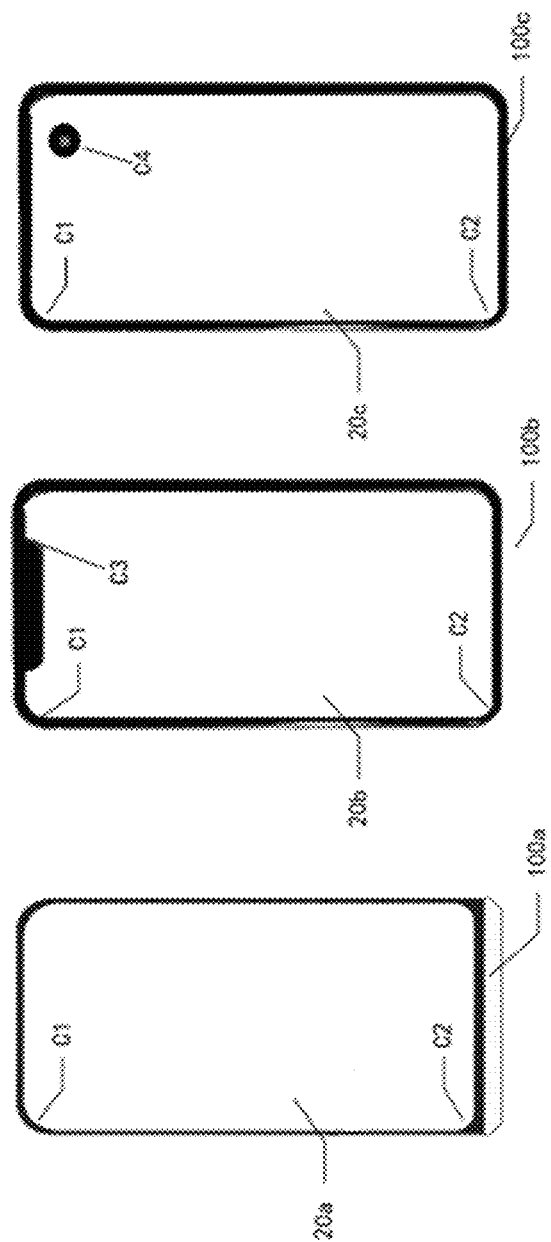
FIG. 1 illustrates an application scenario of a display screen according to certain embodiments of the present disclosure.

Embodiments of the present disclosure will be described with reference to the drawings. These descriptions are merely exemplary and are not intended to limit the scope of the present disclosure. In the following detailed description, for ease of explanation, many specific details are set forth to provide a comprehensive understanding of the embodiments of the present disclosure. However, one or more embodiments may be implemented without these specific details. In addition, in the following description, descriptions of well-known structures and techniques may be omitted to avoid unnecessarily obscuring the concepts of the present disclosure.

The terminology used herein is for the purpose of describing particular embodiments only and is not intended to limit the present disclosure. As used herein, the terms "including", "comprising", and the like indicate the presence of stated features, steps, operations, and/or components, but do not preclude the presence or addition of one or more other features, steps, operations, or components.

All terms (including technical and scientific terms) used herein have the meaning commonly understood by those skilled in the art unless otherwise defined. It should be noted that the terms used herein should be interpreted to have meanings consistent with the context of this disclosure, and should not be interpreted in an idealized or overly rigid manner.

Where expressions such as "at least one of A, B, C, and etc." are used, they should generally be interpreted in accordance with the meaning commonly understood by those skilled in the art. For example, "a system having at least one of A, B, and C" shall include but is not limited to a system with A alone, B alone, C alone, A and B, A and C, B and C, and/or A, B, C, etc. When expressions such as "at least one of A, B, or C" are used, they should generally be interpreted in accordance with the meaning commonly understood by those skilled in the art. For example, "a system having at least one of A, B, or C" shall include but is not limited to a system with A alone, B alone, C alone, A and B, A and C, B and C, and/or A, B, C, etc.

The present disclosure provides a display screen according to certain embodiments. The display screen may include a plurality of first pixels and at least one second pixel. Each of the first pixels may include at least three sub-pixels. The plurality of first pixels may constitute a display area of the display screen. Each of the second pixels may include at least three sub-pixels. The arrangement of the three sub-pixels of the second pixel may be different from the arrangement of the three sub-pixels of the first pixel. The at least one second pixel may be located at an edge of the display area. The plurality of first pixels and the at least one second pixel may constitute a pixel array of the display screen.

The present disclosure also provides an electronic device including the display screen according to certain embodiments. The electronic device may include a processor. The processor may be configured to display content on the display screen.

According to certain embodiments of the present disclosure, the pixel array in the display screen may include a first pixel and a second pixel. An arrangement of three sub-pixels of the second pixel may be different from an arrangement of three sub-pixels of the first pixel. A plurality of first pixels may constitute a display area of the display screen. At least one second pixel may be located at the display edge region. If the edge of the display area includes a curved portion, the arrangement manner of three sub-pixels in the second pixel may be determined according to a shape or direction of the curved portion. When the edge of the curved portion of the display area is formed by occluding a portion of the second pixel, the areas of the three un-occluded sub-pixels in the second pixel may to be equal, which may somewhat avoid color distortion or jagged edges at the edges of the curved portion in existing technology.

FIG. 1 illustrates an application scenario of a display screen according to certain embodiments of the present disclosure.

FIG. 1 is only an example of a scenario to which the embodiments of the present disclosure may be applied to help those skilled in the art understand the technical content of the present disclosure. It does not mean that the embodiments of the present disclosure cannot be applied to other devices, system, environment, or scenarios.

As shown in FIG. 1, according to certain embodiments, the display screen may be 20a, 20b or 20c. The display screens 20a, 20b, and 20c may be respectively applied to the electronic devices 100a, 100b, and 100c. The display screens 20a, 20b, and 20c may be non-rectangular display screens. The edges of the display screens 20a, 20b, and 20c may have rounded corners or curved corners.

Specifically, the display screen 20a of the electronic device 100a is a full screen. The four corners of the display screen 20a are rounded, including two upper rounded corners C1 and two lower rounded corners C2. The display screen 20b of the electronic device 100a is a notch display screen. The edges of the display screen 20b include curved portions, which are two upper rounded corners C1, two lower rounded corners C2, and two notch corners C3. The display screen 20c of the electronic device 200c is a cut-out screen. The edges of the display screen 20c include edges of curved portions, including two upper rounded corners C1, two lower rounded corners C2, and a circle C4 around the front camera.

In semiconductor processing, a single pixel is usually rectangular, and a large number of rectangular pixels form a pixel array of a display screen. To form the edges of the smooth curve shown in C1-C4 in FIG. 1, the edge of the display area usually needs to use a light-shielding material (for example, a Black Matrix) with a corresponding curved boundary line, which will be located at C1-C4. Each pixel at the edge of the curve portion shown may be partially occluded. For example, the display screen 20a, 20b, or 20c may include a transparent cover plate on top of the pixel array, and a light-blocking region may be provided with boundary lines corresponding to C1-C4.

In an RGB color mode, a single pixel may include three sub-pixels of red R, green G, and blue B. The size of the area occupied by three sub-pixels in a pixel may be identical. However, when each pixel is partially occluded at the edge of the curved portion shown by C1-C4, the area ratio of three sub-pixels in the un-occluded portion may be affected. If the areas of the three sub-pixels in the un-occluded portion have a significant difference, it will cause color distortion at the edges of the curved portion shown by C1-C4. To address this problem, according to certain embodiments, the pixels disposed at the edge portion of the curves shown as C1-C4 may be configured as second pixels. The arrangement of the three sub-pixels of the second pixels may correspond to the curve portions C1-C4, which may make the un-occluded areas of the three sub-pixels in the second pixel equal to teach other. Thus, it is possible to effectively reduce the degree of color distortion at the edges of the curved portions similar to those shown by C1-C4.

It should be noted that FIG. 1 merely exemplifies, but does not limit, the application scenarios of the display screen according to embodiments of the present disclosure. The display screen may be applied to any electronic device having a display area with a non-rectangular border. For example, the display area of the electronic device may include a circular area, a display area with rounded corners, a special-shaped display area, and an irregular polygon display area.

Figure 2:
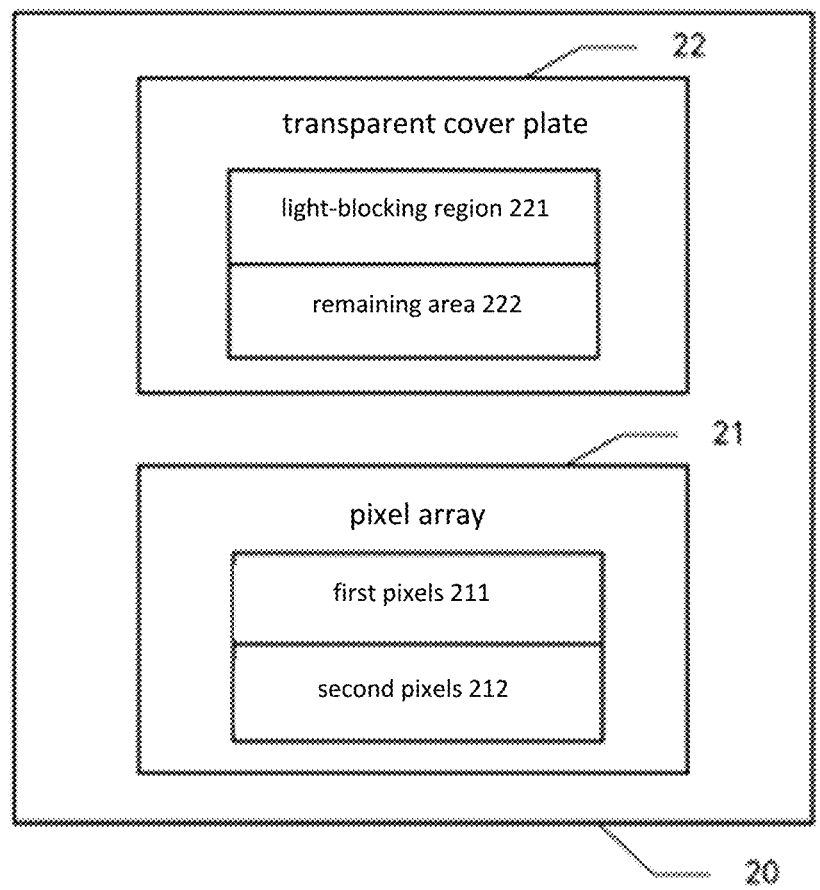
FIG. 2 is a block diagram showing a display screen according to certain embodiments.

FIG. 2 is a structural block diagram of a display screen 20 according to certain embodiments of the present disclosure. The display screens 20a, 20b and 20c shown in FIG. 1 may be three specific embodiments of display screen 20.

Figure 4A:
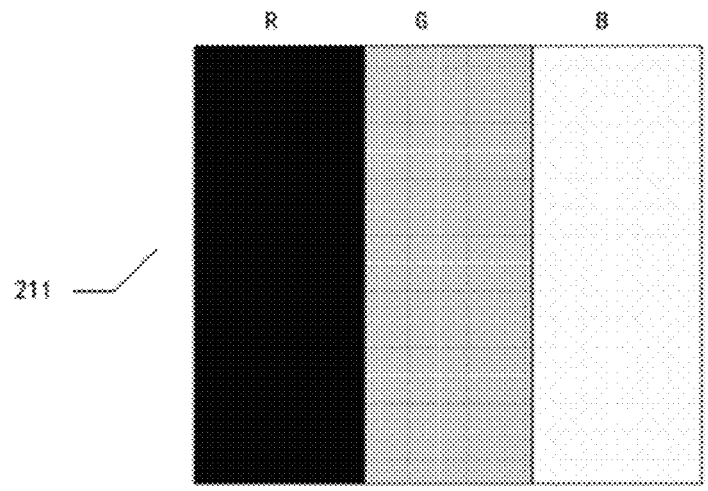
FIG. 4A illustrates an arrangement of sub-pixels of a first pixel according to certain embodiments.
Figure 4B:
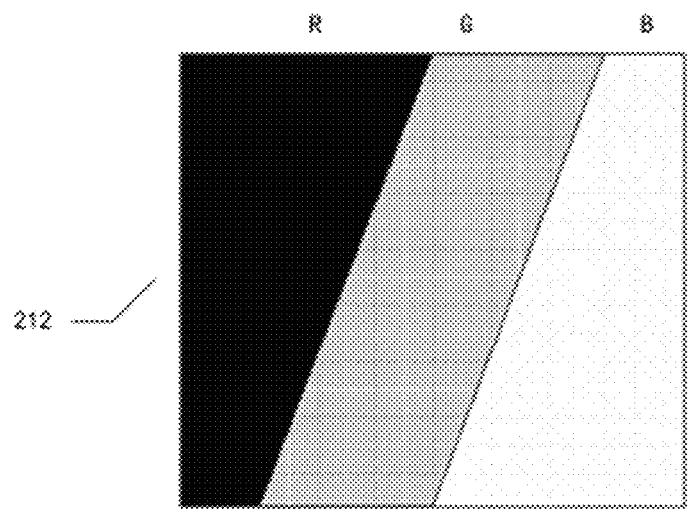
FIG. 4B illustrates an arrangement of sub-pixels of a second pixel according to certain embodiments.

As shown in FIG. 2, according to certain embodiments of the present disclosure, the display screen 20 may include a plurality of first pixels 211 and at least one second pixel 212. Each first pixel 211 may include at least three sub-pixels, and the plurality of first pixels 211 may constitute a display area of the display screen 20. Each second pixel 212 may include at least three sub-pixels. The three sub-pixels of the second pixel 212 are arranged in a different manner from the three sub-pixels arranged in the first pixel 211. For example, the three subpixels of the first pixel 211 may be in arranged as shown in FIG. 4A. The three sub-pixels of the second pixels 212 may be arranged as shown in FIG. 4B. The at least one second pixel 212 is located at an edge of the display area. The plurality of first pixels 211 and the at least one second pixel 212 constitute a pixel array 21 of the display screen 20.

According to certain embodiments of the present disclosure, the display screen 20 may further include a transparent cover plate 22. An inner surface of the transparent cover plate 22 may have a light-blocking region 221. A boundary between the light-blocking region 221 and the remaining region 222 of the transparent cover plate 22 may include at least one curved portion. The transparent cover plate 22 may be located above the pixel array 21. The curved portion of the boundary pixels of the pixel array 21 correspond to second pixels 212. The light-blocking region 221, for example, may be a black matrix formed by a metal thin film or black films.

Figure 3:
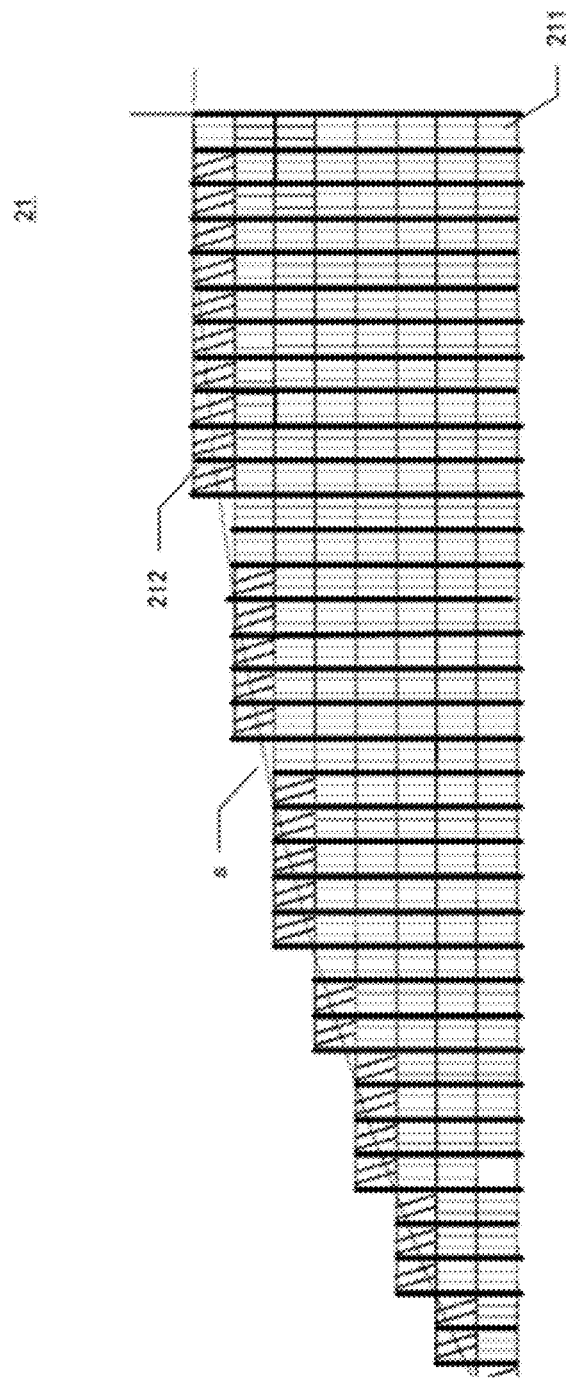
FIG. 3 illustrates an array of pixels close to a rounded corner of a display screen according to certain embodiments.

FIG. 3 illustrates a pixel array 21 near one rounded corner of the display screen 20 according to certain embodiments of the present disclosure.

FIG. 4A illustrates an arrangement of sub-pixels of a first pixel 211 according to certain embodiments. FIG. 4B illustrates an arrangement of sub-pixels of a second pixel 212 according to certain embodiments.

As shown in FIG. 3, the pixel array 21 near a rounded corner of the display screen 20 (for example, C1 or C2 in FIG. 1) includes a plurality of first pixels 211 and at least one second pixel 212. The plurality of first pixels 211 constitute a display area of the display screen 20, and the at least one second pixel 212 is located at an edge of the display area. Specifically, in FIG. 3, the edge of the display area is a curve s, and the curve s corresponds to the boundary between the light-blocking region 221 of the transparent cover plate 22 (not shown in FIG. 3) and the remaining area 222 of the transparent cover plate 22. The second pixels 212 are arranged in a region through which the curve s passes.

The display effect of the curve s may be formed by the shielding effect of the light-blocking region 221 in the transparent cover plate 22. Specifically, the light-blocking region 221 may block the upper left half of the second pixel 212 that curve s passes through as shown in FIG. 3, so that only the lower right side of the second pixel 212 may be visible.

It should be noted that although it is illustrated in FIG. 3 that the pixels passing through by the curve s are all second pixels 212, in certain designs, it is possible to only configure pixels that have a large part being blocked as second pixels 212 to reduce the number of designs of the second pixel 212 in the design process and reduce the process complexity.

FIG. 4A and FIG. 4B are enlarged views of the first pixel 211 and the second pixel 212 in FIG. 3. Referencing FIG. 3, FIGS. 4A and 4B, according to certain embodiments, the areas occupied by the three sub-pixels in the second pixel 212 are different from the areas occupied by the three sub-pixels of the first pixel 211. In an RGB color mode, the three sub-pixels may include a red (R) sub-pixel, a green (G) sub-pixel, and a blue (B) sub-pixel.

Referring to FIG. 4B, according to certain embodiments, the boundary lines dividing the areas occupied by the three sub-pixels in the second pixel 212 are parallel to each other. They also form a second angle with a first side of the substrate of the second pixel 212. The second angle is not 90° or 180°. Referring to FIG. 4A, the boundary lines dividing the areas occupied by the three sub-pixels in the first pixel 211 are parallel to each other. They also form a first angle with a first side of the substrate of the first pixel 211. The second angle is 90° or 180°.

Specifically, the first pixel 211 and the second pixel 212 may be rectangular pixels of a same size. The three sub-pixels in the first pixel 211 are arranged next to each other. The two boundary lines dividing the areas occupied by the three sub-pixels in the first pixel 211 are parallel to each other. They are parallel or perpendicular to a first side of the substrate of the first pixel 211. The three sub-pixels in the second pixel 212 are arranged next to each other. The two boundary lines dividing the areas occupied by the three sub-pixels in the second pixel 212 are parallel to each other. They are neither parallel nor perpendicular to a first side of the substrate of the second pixel 212. The different arrangements of the three sub-pixels of the second pixel 212 and the first pixel 211 is such that when the transparent cover plate 22 is disposed above the pixel array 21 and a light-blocking region 221 blocks a part of the second pixel 212, the portions of the three sub-pixels corresponding to the portion of the second pixels 212 that are not blocked by the light-blocking region 221 tends to be equal. Thus, color distortion at the edges of the curved portion of the display screen 20 is reduced. For details, refer to the schematic diagrams of FIGS. 5A and 5B.

Figure 5A:
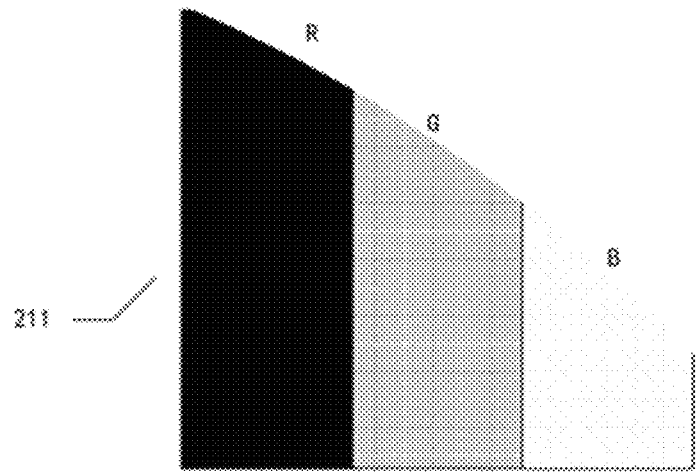
FIG. 5A illustrates a portion where a first pixel is blocked by a light-blocking region having a curved boundary line according to certain embodiments.
Figure 5B:
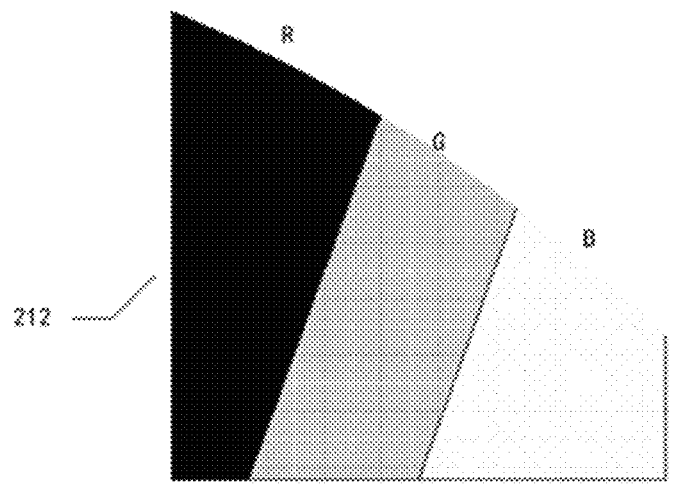
FIG. 5B illustrates a portion where a second pixel is blocked by a light-blocking region having a curved boundary line according to certain embodiments.

FIG. 5A illustrates a portion of the first pixel 211 being blocked by a light-blocking region 221 having a curved boundary line. FIG. 5B illustrates a portion of the second pixel 212 being blocked by a light-blocking region 221 having the same curve boundary as that of FIG. 5A.

As shown in FIGS. 5A and 5B, according to certain embodiments of the present disclosure, if the transparent cover plate 22 is disposed above the pixel array 21, the light-blocking region 221 covers at least a part of the second pixel 212. The portions of the three sub-pixels corresponding to the portion of the second pixels 212 that are not blocked by the light-blocking region 221 tend to be equal to each other.

Comparing FIG. 5A with FIG. 5B, it can be seen that after being blocked by the light blocking region 221 having a same curve boundary, the area of the three sub-pixels corresponding to the portion of the second pixel 212 not blocked by the light blocking region 221 are closer to a 1:1:1 ratio compared to the portions of the three sub-pixels corresponding to the portion of the first pixel 211 not blocked by the light-blocking region 221 is closer to 1:1:1.

According to certain embodiments of the present disclosure, a boundary between the light-blocking region 221 and the remaining region 222 of the transparent cover plate 22 may include a plurality of curved portions. Pixels corresponding to the curved portions of the boundary line in the pixel array 21 are second pixels 212.

The boundary lines dividing the areas occupied by the three sub-pixels in the second pixel 212 have a direction corresponding to the corresponding curved portion of the boundary line.

The boundary between the light-blocking region 221 and the remaining region 222 of the transparent cover plate 22 may include a plurality of curved portions. For example, in FIG. 1, for display 20a, the light blocking region 221 and the remaining region 222 boundary of the transparent cover plate 22 includes rounded corners C1 and C2. The boundary between the light-blocking region 221 and the remaining area 222 of the transparent cover plate 22 in the display screen 20b includes rounded corners C1 and C2, and also includes notch corners C3. The boundary between the light-blocking region and the remaining area 222 of the transparent cover plate 22 in the display screen 20c includes rounded corners C1 and C2, and also includes a circle C4.

According to certain embodiments, the boundary lines dividing the areas occupied by the three sub-pixels in the second pixel 212 correspond to the curved portion of the boundary line corresponding to the second pixel 212. For example, the boundary lines dividing the areas occupied by the three sub-pixels in the second pixel 212 may have a direction corresponding to the curved portion of the boundary line corresponding to the second pixel 212. For example, the boundary lines may be perpendicular or approximately perpendicular to a tangent direction of the curve portion corresponding to the second pixel 212. Alternatively, for example, the boundary lines dividing the areas occupied by the three sub-pixels in the second pixel 212 may have positions corresponding to the curved portion of the boundary line corresponding to the second pixel 212, so that the portions of the three sub-pixels corresponding to the portion of the second pixels 212 that are not blocked by the light-blocking region 221 tend to be equal to each other.

By configuring the direction or positions of the boundary lines dividing the respective regions occupied by the three sub-pixels in the second pixel 212 according to the shape and direction of the curved portion of the boundary between the light-blocking region 221 and the remaining region 222 of the transparent cover plate 22, the areas of the three sub-pixels that are not displayed may be more balanced, reducing color distortion at the edge of the display area.

Figure 6:
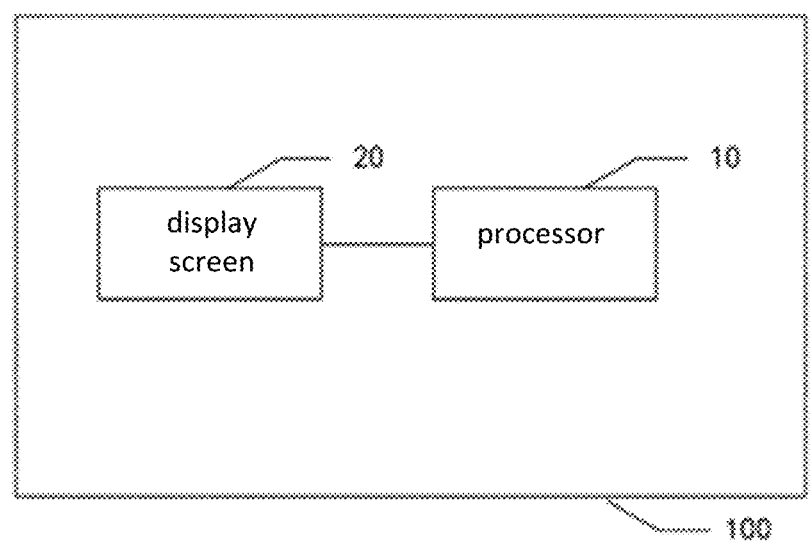
FIG. 6 is a block diagram of an electronic device according to certain embodiments of the present disclosure.

FIG. 6 is a structural block diagram of an electronic device 100 according to certain embodiments of the present disclosure. The electronic device 100a, 100B and 100c in FIG. 1 may be specific embodiments of the electronic device 100.

As shown in FIG. 6, according to certain embodiments of the present disclosure, the electronic device 100 may include a display screen 20 and a processor 10. The processor 10 may be configured to display content on the display screen 20.

As described above, the display screen 20 may include a plurality of first pixels 211 and at least one second pixel 212. Each first pixel 211 includes at least three sub-pixels, and the plurality of first pixels 211 constitute a display area of the display screen 20. The three sub-pixels of the second pixel 212 are arranged in a different manner from the three sub-pixels arranged in the first pixel 211. For example, three subpixels of the first pixel 211 may be in arranged as shown in FIG. 4A. The three sub-pixels of the second pixels 212 may be arranged as shown in FIG. 4B. The three sub-pixels of the second pixels 212 may be arranged as shown in FIG. 4B. The at least one second pixel 212 is located at an edge of the display area. The plurality of first pixels 211 and the at least one second pixel 212 constitute a pixel array 21 of the display screen 20.

According to certain embodiments, referencing FIGS. 4A and 4B, the areas occupied by the three sub-pixels in the second pixel 212 are different from the areas occupied by the three sub-pixels of the first pixel 211. In an RGB color mode, the three sub-pixels may include a red (R) sub-pixel, a green (G) sub-pixel, and a blue (B) sub-pixel.

According to certain embodiments, the boundary lines dividing the areas occupied by the three sub-pixels in the second pixel 212 are parallel to each other. They also form a second angle with a first side of the substrate of the second pixel 212. The second angle is not 90° or 180°. The boundary lines dividing the areas occupied by the three sub-pixels in the first pixel 211 are parallel to each other. They also form a first angle with a first side of the substrate of the first pixel 211. The second angle is 90° or 180°.

According to certain embodiments of the present disclosure, the display screen 20 may further include a transparent cover plate 22. The inner surface of the transparent cover plate 22 has a light-blocking region 221. A boundary between the light-blocking region 221 and the remaining region 222 of the transparent cover plate 22 may include at least one curved portion. The transparent cover plate 22 may be located above the pixel array 21. The curved portion of the boundary pixels of the pixel array 21 correspond to second pixels 212. The light-blocking region 221, for example, may be a black matrix formed by a metal thin film or black films.

In addition, referring to FIGS. 5A and 5B, in the electronic device 10, if the transparent cover plate 22 is disposed above the pixel array 21 of the display screen 20, the light-blocking region 221 at least covers a part of the second pixel 212. The areas of the three sub-pixels corresponding to the portion of the two pixels 212 that are not blocked by the light-blocking region 221 tend to be equal in size.

According to certain embodiments of the present disclosure, the pixel array 21 in the display screen 20 of the electronic device 100 includes a first pixel 211 and a second pixel 212. The three sub-pixels of the second pixel 212 are arranged in a different manner from the three sub-pixels arranged in the first pixel 211. The plurality of first pixels 211 constitute a display area of the display screen 20. And at least one second pixel 212 located in the display edge region. Thus, if the edge of the display area includes a curved portion, the arrangement manner of the three sub-pixels in the second pixel 212 may be determined correspondingly according to the shape of the curved portion. Therefore, when the edge of the curved portion of the display area is formed by partially blocking the second pixel 212, the areas of the three un-blocked sub-pixels in the second pixel 212 tend to be equal in size, which may somewhat avoid color distortion or jagged edges at the edges of the curved portion in existing technology. Therefore, the display of the electronic device is neater and pleasing, thus improving user experience.

Those skilled in the art can understand that the features described in the various embodiments and/or claims of the present disclosure may be combined in various ways, even if such a combination or combination is not explicitly described in the present disclosure. Various features and/or combinations of features described in various embodiments and/or claims of the present disclosure may be made without departing from the spirit and teachings of the present disclosure. All of these combinations and/or variations fall within the scope of the disclosure.

Although the present disclosure has been shown and described with reference to specific exemplary embodiments thereof, those skilled in the art will understand that without departing from the spirit and scope of the present disclosure as defined by the appended claims and their equivalents, various changes in form and detail may be made to the present disclosure. Therefore, the scope of the present disclosure should not be limited to the embodiments described above, but should be determined not only by the appended claims, but also by the equivalents of the appended claims.

What is claimed is:

1. A display screen, comprising:
   a plurality of first pixels, each first pixel including three sub-pixels, the plurality of first pixels constituting a display area of the display screen; and
   one or more second pixels, each second pixel including three sub-pixels, an arrangement of the three sub-pixels of the second pixel being different from an arrangement of the three sub-pixels of the first pixel, and the one or more second pixels being located at an edge of the display area, wherein:
   the plurality of first pixels and the one or more second pixels constitute a pixel array of the display screen;
   areas occupied by the three sub-pixels of the second pixel are different from areas occupied by the three sub-pixels of the first pixel;
   boundary lines dividing the areas occupied by the three sub-pixels of the second pixel are parallel to each other and form a second angle with a first side of a substrate of the second pixel, the second angle not being equal to 90° or 180°; and
   boundary lines dividing the areas occupied by the three sub-pixels of the first pixel are parallel to each other and form a first angle with a first side of a substrate of the first pixel, the first angle being 90° or 180°.

2. The display screen according to claim 1, further comprising:
   a transparent cover plate, an inner surface of the transparent cover plate having a light-blocking region and a remaining area, and a boundary between the light-blocking region the remaining area of the transparent cover plate including at least one curved portion;
   wherein the transparent cover plate is located above the pixel array, and one or more pixels of the pixel array corresponding to a curve portion of the boundary line are one or more second pixels.

3. The display screen according to claim 2, wherein:
   the light-blocking region covers at least a first portion of each second pixel; and
   areas of the three sub-pixels corresponding to a second portion of the second pixel that is not blocked by the light-blocking region are equal in size.

4. The display screen according to claim 2, wherein:
   the boundary between the light-blocking region and the remaining area of the transparent cover plate includes a plurality of curved portions; and
   for each curved portion, a pixel corresponding to the curve portion is one of the second pixels.

5. The display screen according to claim 2, wherein:
   the light-blocking region includes a black matrix.

6. The display screen according to claim 1, wherein:
   the three sub-pixels of each first pixel includes a red sub-pixel, a green sub-pixel, and a blue sub-pixel; and
   the three sub-pixels of each second pixel includes a red sub-pixel, a green sub-pixel, and a blue sub-pixel.

7. The display screen according to claim 1, wherein:
   the display screen includes one or more rounded corners.

8. The display screen according to claim 1, wherein:
   the display screen includes a circular hole.

9. An electronic device, comprising:
   a display screen; and
   a processor, configured to display content on the display screen;
   wherein the display screen includes:
   a plurality of first pixels, each first pixel including three sub-pixels, the plurality of first pixels constituting a display area of the display screen; and
   one or more second pixels, each second pixel including three sub-pixels, an arrangement of the three sub-pixels of the second pixel being different from an arrangement of the three sub-pixels of the first pixel, and the one or more second pixels being located at an edge of the display area wherein:
   the plurality of first pixels and the one or more second pixels constitute a pixel array of the display screen;

areas occupied by the three sub-pixels of the second pixel are different from areas occupied by the three sub-pixels of the first pixel;

boundary lines dividing the areas occupied by the three sub-pixels of the second pixel are parallel to each other and form a second angle with a first side of a substrate of the second pixel, the second angle not being equal to 90° or 180°; and boundary lines dividing the areas occupied by the three sub-pixels of the first pixel are parallel to each other and form a first angle with a first side of a substrate of the first pixel, the first angle being 90° or 180°.

10. The electronic device according to claim 9, wherein the display screen further includes:

a transparent cover plate, an inner surface of the transparent cover plate having a light-blocking region and a remaining area, and a boundary between the light-blocking region the remaining area of the transparent cover plate including at least one curved portion;

wherein the transparent cover plate is located above the pixel array, and one or more pixels of the pixel array corresponding to a curve portion of the boundary line are one or more second pixels.

11. The electronic device according to claim 10, wherein:

the light-blocking region covers at least a first portion of each second pixel; and areas of the three sub-pixels corresponding to a second portion of the second pixel that is not blocked by the light-blocking region are equal in size.

12. The electronic device according to claim 10, wherein:

the boundary between the light-blocking region and the remaining area of the transparent cover plate includes a plurality of curved portions; and for each curved portion, a pixel corresponding to the curve portion is one of the second pixels.

13. The electronic device according to claim 10, wherein:
the light-blocking region includes a black matrix.

14. The electronic device according to claim 9, wherein:

the three sub-pixels of each first pixel includes a red sub-pixel, a green sub-pixel, and a blue sub-pixel; and the three sub-pixels of each second pixel includes a red sub-pixel, a green sub-pixel, and a blue sub-pixel.

15. The electronic device according to claim 9, wherein:
the display screen includes one or more rounded corners.

16. The electronic device according to claim 9, wherein:
the display screen includes a circular hole.

\* \* \* \* \*